US006604067B1

(12) United States Patent
Abraham et al.

(10) Patent No.: US 6,604,067 B1
(45) Date of Patent: Aug. 5, 2003

(54) RAPID DESIGN OF MEMORY SYSTEMS USING DILATION MODELING

(75) Inventors: Santosh G. Abraham, Pleasanton, CA (US); Bantwal Ramakrishna Rau, Los Altos, CA (US); Scott A. Mahlke, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/378,192

(22) Filed: Aug. 20, 1999

(51) Int. Cl.[7] ............................................. G06F 9/30
(52) U.S. Cl. ........................ 703/21; 703/22; 703/26; 703/27
(58) Field of Search ....................... 703/21, 15, 22, 703/26, 27; 712/208, 222; 717/153

(56) References Cited

U.S. PATENT DOCUMENTS

| | | | |
|---|---|---|---|
| 6,002,875 A | * 12/1999 | Stolberg | 717/153 |
| 6,006,277 A | * 12/1999 | Talati et al. | 703/27 |
| 6,021,261 A | * 2/2000 | Barrett et al. | 714/37 |
| 6,105,124 A | * 8/2000 | Farber et al. | 712/208 |
| 6,185,732 B1 | * 2/2001 | Mann et al. | 712/227 |
| 6,226,776 B1 | 5/2001 | Panchul et al. | 716/3 |
| 6,249,880 B1 | * 6/2001 | Shelly et al. | 714/34 |

OTHER PUBLICATIONS

Rau et al., "Machine–Description Driven Compilers for EPIC Processors," HPL–98–40 981016.*
S. Aditya, B. Rau, V. Kathail, Automatic Architectural Synthesis of VLIW and EPIC Processors, HP: Technical Report: HPL—1999–93.*
B. Rau, M. Schlansker, "Embedded Computing: New Directions in Architecture and Automation," HP: Technical Report: HPL—2000–115.*
S. Abraham, B. Rau, R. Schreiber, G. Snider, M. Schlansker, "Efficient Design Space Exploration in PICO," Proc. CASES 2000 International Conference on Compilers. Architecture and Synthesis for Embedded Systems (San Jose, California Nov. 2000), 71–79.*
A. Agarwal, M. Horowitz, and J. Hennessy, "An Analytical Cache Model," ACM Transactions on Computer Systems, vol. 7, No 2, pp. 184–215, May, 1989.
P. Steenkiste, "The Impact of Code Density on Instruction Cache Performance," presented at Proc. of 16th International Symposium on Computer Architecture, 1989.

* cited by examiner

Primary Examiner—Russell Frejd
Assistant Examiner—Samarina Makhdoom

(57) ABSTRACT

A system is provided which simplifies and speeds up the process of designing a computer system by evaluating the components of the memory hierarchy for any member of a broad family of processors in an application-specific manner. The system uses traces produced by a reference processor in the design space for a particular cache design and characterizes the differences in behavior between the reference processor and an arbitrarily chosen processor. The differences are characterized as a series of dilation parameters which relate to how much the traces would expand because of the substitution of a target processor. In addition, the system characterizes the reference trace using a set of trace parameters that are part of a cache behavior model. The dilation and trace parameters are used to determine the factors for estimating the performance statistics of target processors with specific memory hierarchies.

20 Claims, 3 Drawing Sheets

RAPID DESIGN OF MEMORY SYSTEMS USING DILATION MODELING

CROSS-REFERENCE TO RELATED APPLICATIONS

The present application contains subject matter related to a concurrently filed U.S. Patent Application by Shail Aditya Gupta, Bantwal Ramakrishna Rau, Vinod Kumar Kathail, and Michael S. Schlansker entitled "AUTOMATIC DESIGN OF VLIW PROCESSORS". The related application is identified by U.S. Pat. No. 6,385,757 and is incorporated herein by reference thereto.

The present application also contains subject matter related to a concurrently filed U.S. Patent Application by Michael S. Schlansker, Vinod Kumar Kathail, Greg Snider, Shail Aditya Gupta, Scott A. Mahlke and Santosh G. Abraham entitled "AUTOMATED DESIGN OF PROCESSOR SYSTEMS USING FEEDBACK FROM INTERNAL MEASUREMENTS OF CANDIDATE SYSTEMS". The related application is identified by U.S. patent application Ser. No. 09/502,194 and is incorporated herein by reference thereto.

The present application also contains subject matter related to a concurrently filed U.S. Patent Application by Santosh G. Abraham, Scott A. Mahlke, and Vinod K. Kathail, and entitled "RETARGETABLE COMPUTER DESIGN SYSTEM". The related application is identified by U.S. patent application Ser. No. 09/378,580 and is hereby incorporated by reference thereto.

TECHNICAL FIELD

The present invention relates generally to high performance computer systems and more particularly to the automated design of such systems.

BACKGROUND ART

A vast number of devices and appliances ranging from mobile phones, printers, and cars have embedded computer systems. The number of embedded computer systems in these devices far exceeds the number of general-purpose computer systems such as PCs or servers. In the future, the sheer number of these embedded computer systems will greatly exceed the number of general-purpose computer systems.

The design process for embedded computer systems is different from that for general purpose computer systems. There is greater freedom in designing embedded computer systems because there is often little need to adhere to standards in order to run a large body of existing software. Since embedded computer systems are used in very specific settings, they may be tuned to a much greater degree for certain applications. On the other hand, though there is greater freedom to customize and the benefits of customization are large, the revenue stream from a particular embedded computer system design is typically not sufficient to support a custom design.

In designing embedded computer systems, the general design space generally consists of a processor and associated Level-1 instruction, Level-1 data, and Level-2 unified caches, and main memory. The number and type of functional units in the processor may be varied to suit the application. The size of each of the register files may also be varied. Other aspects of the processor such as whether it supports speculation or predication may also be changed. For each of the caches, the cache size, the associativity, the line size and the number of ports can be varied. Given a subset of this design space, an application, and its associated data sets, a design objective is to determine a set of cost-performance optimal processors and systems. A given design is cost-performance optimal if there is no other design with higher performance and lower cost.

While designing the cache hierarchy, it is necessary to know how the processor acts because there is some dependence between the processor and the cache hierarchy. When both are being designed together, there is a severe problem because there are two subsystems and one subsystem is somewhat weakly dependent on the behavior of the other subsystem. Currently, evaluating a particular cache design for a particular processor design requires generating the address trace for that design and running this trace through a cache simulator. To design the overall computer system, it is necessary to take the cross-products of all possible cases of the cache subsystem first and cases of the processor subsystem second, and individually consider each of those cases, which is extremely time consuming.

Because of the multi-dimensional design space, the total number of possible designs can be very large. Even allowing a few of the processor parameters to vary, easily leads to a set of 40 or more processor designs. Similarly, there may be 20 or more possible cache designs for each of the three cache types.

For a typical test program, the sizes of the data, instruction, and unified traces are 450 M (million), 1200M, and 1650M, respectively, and the combined address trace generation and simulation process takes 2, 5, and 7 hours, respectively. Even in a design space with only 40 processors and only 20 caches of each type, each cache has to be evaluated with the address trace produced by each of the 40 processors. Thus, evaluating all possible combinations of processors and caches takes $(40 \times 20 \times (2+5+7))$ hours which comes out to 466 days and 16 hours of around the clock computation. Such an evaluation strategy is clearly costly and unacceptable.

DISCLOSURE OF THE INVENTION

The present invention provides a system which simplifies and speeds up the process of designing a computer system by evaluating the components of the memory hierarchy for any member of a broad family of processors in an application-specific manner. The system uses traces produced by a reference processor in the design space for a particular cache design and characterizes the differences in behavior between the reference processor and an arbitrarily chosen processor. The differences are characterized as a series of "dilation" parameters which relate to how much the traces would expand because of the substitution of a target processor. In addition, the system characterizes the reference trace using a set of trace parameters that are part of a cache behavior model. The dilation and trace parameters are used to determine the factors for estimating the performance statistics of target processors with specific memory hierarchies. In a design space with 40 processors and 20 caches of each type, each cache hierarchy has to be evaluated with the address trace produced by only 1 of the 40 processors. Thus, evaluating all possible combinations of processors and caches only takes $(1 \times 20 \times (2+5+7))$ hours or 11 days and 16 hours of computation rather than 466 days and 16 hours.

The present invention provides a process for determining the performance of a computer system for a specific target processor, application, and cache hierarchy. A user or separate design system is subsequently responsible for selecting the particular cache used at each level, based on the performance results provided by this process for a set of cache configurations.

The present invention further provides for simulation of all the target cache hierarchies of interest with respect to the reference processor and evaluation of the cache hierarchies with respect to any other target processors. The code characteristics of the reference processor and an arbitrarily selected processor are determined and used to derive the dilation parameters and factors to determine the performance statistics of the target processors.

The present invention still further provides a method for quickly determining the dilation parameters and factors.

The present invention still further provides for evaluation of general-purpose systems using the dilation parameters.

The present invention produces relative computer system performance metrics for any design point in a simulation-efficient manner, viz. the number of data, instruction and unified cache misses.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
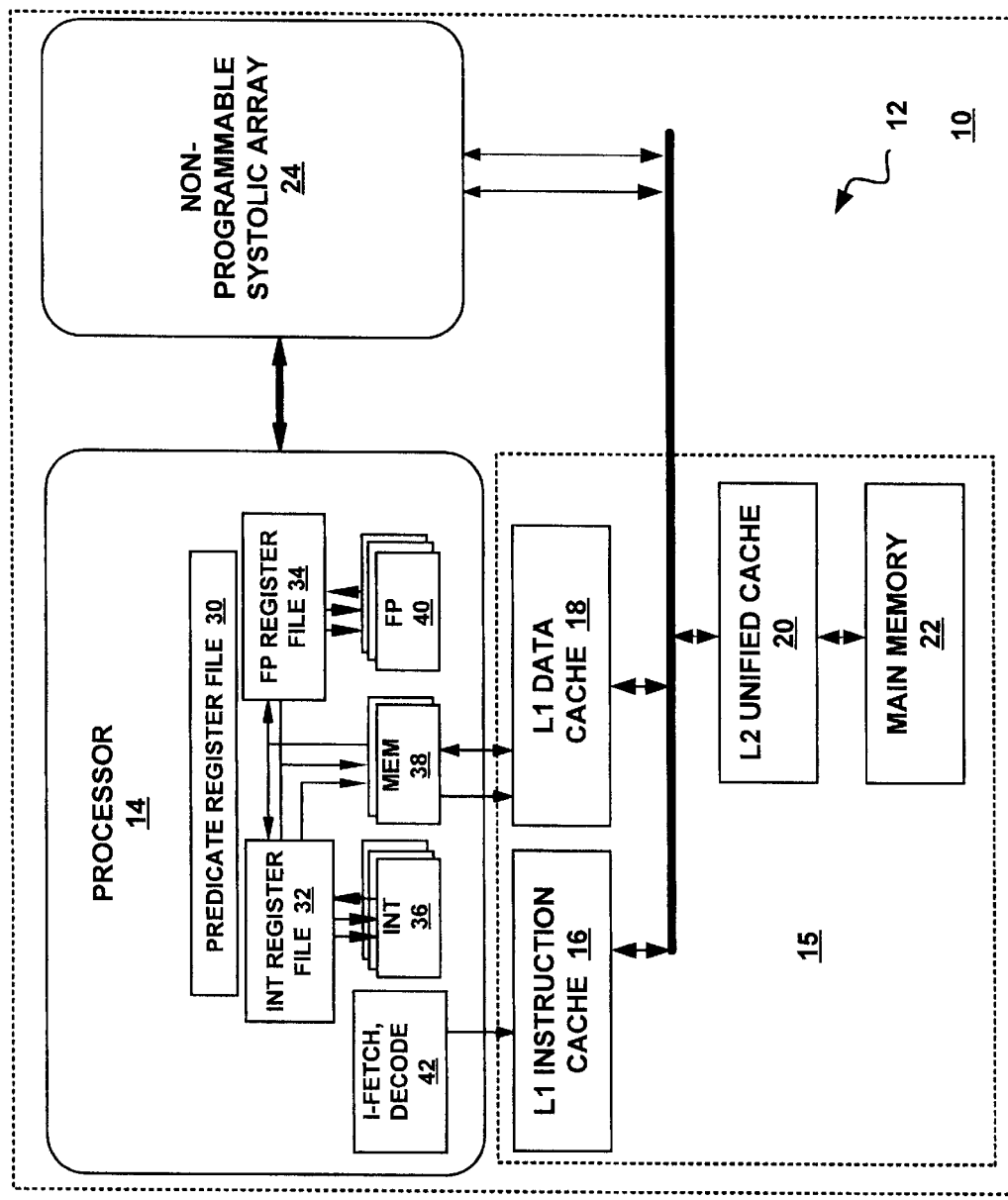
FIG. 1 shows the overall design space with which the present invention is used.

Referring now to FIG. 1, therein is shown the overall design space 10 for a new, or "target" computer system. In the design space 10 is a complete target processor system 12. The complete target processor system 12 consists of a single-cluster, heterogeneous, very long instruction word (VLIW), target processor 14 and a target cache system, or cache hierarchy 15. The cache hierarchy 15 can consist, optionally, of a Level-1 (L1) instruction cache 16, (L1) data cache 18, a Level-2 (L2) unified cache 20, and a main memory 22. Also included in the overall design space 10 is a non-programmable systolic array 24, which can be a co-processor or media accelerator hardware that affects the L2 unified cache 20 and/or the main memory 22.

The number and type of functional units in the processor 14 may be varied to suit the application. The size of each of the register files may also be varied, such as predicate register 30, integer (INT) register 32, and floating point (FP) register 34 files. Other aspects of the processor 14 such as whether it supports speculation or predication may also be changed. The processor design space is parameterized, and the parameters, such as the number of integer 36, memory 38, and floating point 40 units, can be set to attain the desired levels of performance or cost. The same parameters may be varied for the instruction fetching (I-fetch), decode unit 42. Each of the caches is also parameterized with respect to the cache size, associativity, line size and number of ports.

A reference processor system (not shown) would be substantially the same as the target processor system 12 with only the processor being slightly different. In practice, the reference processor would be modeled or simulated with the same series of cache hierarchies that a large number of target processors would be modeled with, as will later be explained.

Figure 2:
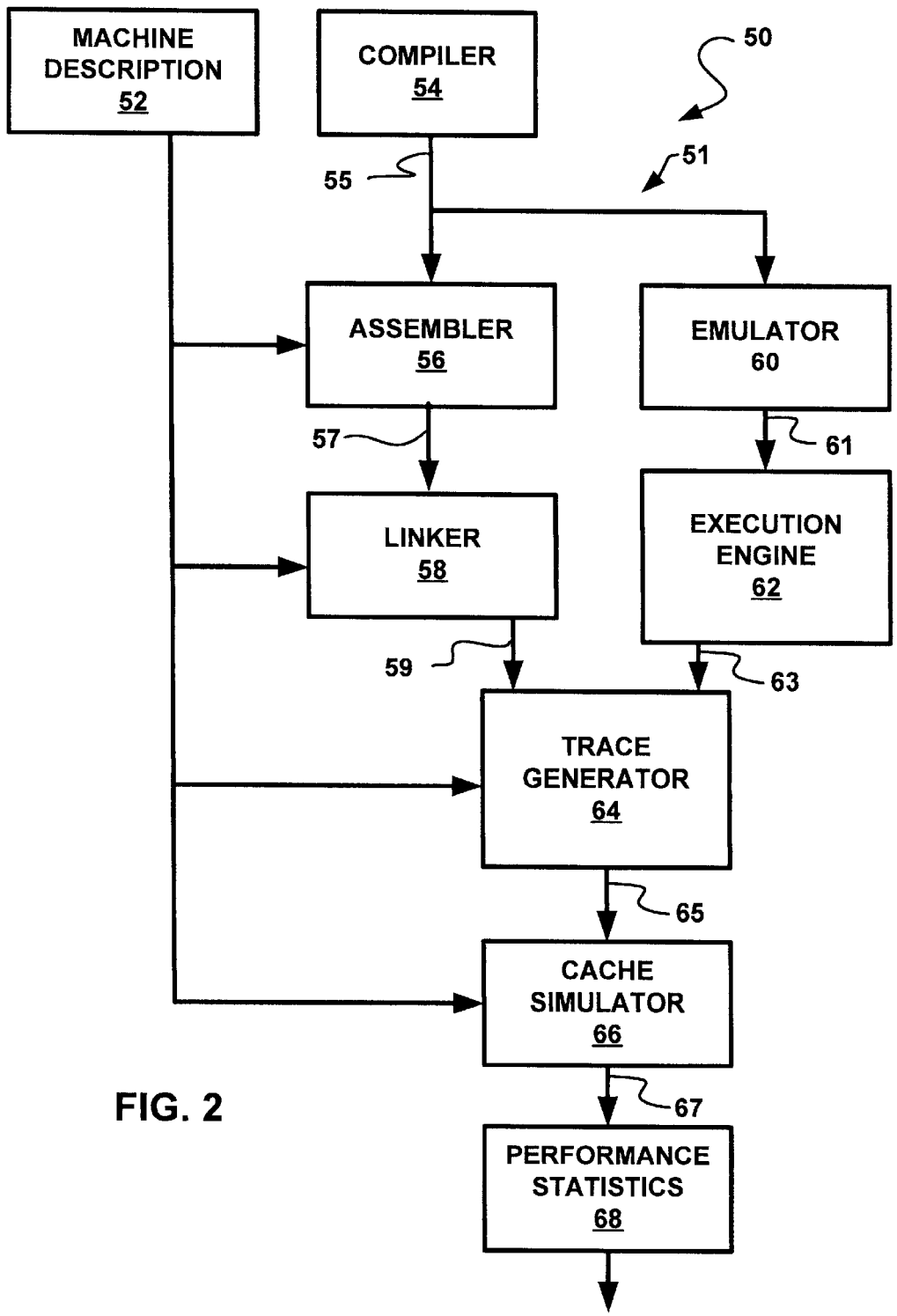
FIG. 2 shows the operational structure of a computer design system used with the present invention.

Referring now to FIG. 2, therein is shown the computer design system 50 having a machine description module 52 and a compiler module 54. The compiler module 54 contains a predetermined user program that has been scheduled and register allocated for a target computer system and outputs the program as input files 55, into an assembler 56. The assembler 56 converts the input files 55 into machine implementation files, such as implementation files 57, using input from the machine description module 52. These machine dependent implementation files 57 are inputted into a linker 58, which combines them into a single executable program 59.

The linker 58 using input from the machine description module 52 establishes where an instruction goes into memory, how the instructions are organized in memory, etc. so as to run on the target computer system 12. The executable program 59 is provided to a machine dependent trace generator 64.

Referring back to the compiler module 54, the output of multiple input files 55 are input into an emulator 60. The emulator 60 takes the multiple input files 55 and inserts additional assembly code instructions to record events, such as segments of code accessed and where it is placed. It then compiles them as a probe executable program 61. A processor independent execution engine 62 then runs the probe executable program 61. As the program runs, it executes the probes, and this produces an event trace 63.

The executable program 59 from the linker 58 and the event trace 63 from the execution engine 62 are combined in a trace generator 64 using input from the machine description module 52. Thus, the executable program 59 and a machine independent trace 63 are combined to produce a new address trace 65 output from the trace generator 64 which would indicate the events which the target computer system 12 would see. Then the address trace 65 is fed into a cache simulator 66.

The trace generator 64 provides the address trace 65 to the cache simulator 66, which outputs performance statistics of a target computer system 12. A performance statistics module 68 is shown where the information can be stored. Referring back to the machine description module 52, information from this module is provided to the assembler 56, the linker 58, the trace generator 64, and the cache simulator 66.

The cache simulator 66 accepts a parameter list specifying the range of cache designs of interest and an address trace 65 from the trace generator 64. The cache simulator 66 simulates all the caches in the design space 10 and provides the performance characteristics of the caches such as the number of misses or stall cycles as an output 67 to the performance statistics module 68.

With the performance statistics for one processor and different cache hierarchies, a dilation model can be used to determine the behavior of different computer systems with other processors and the same cache hierarchies.

Figure 3:
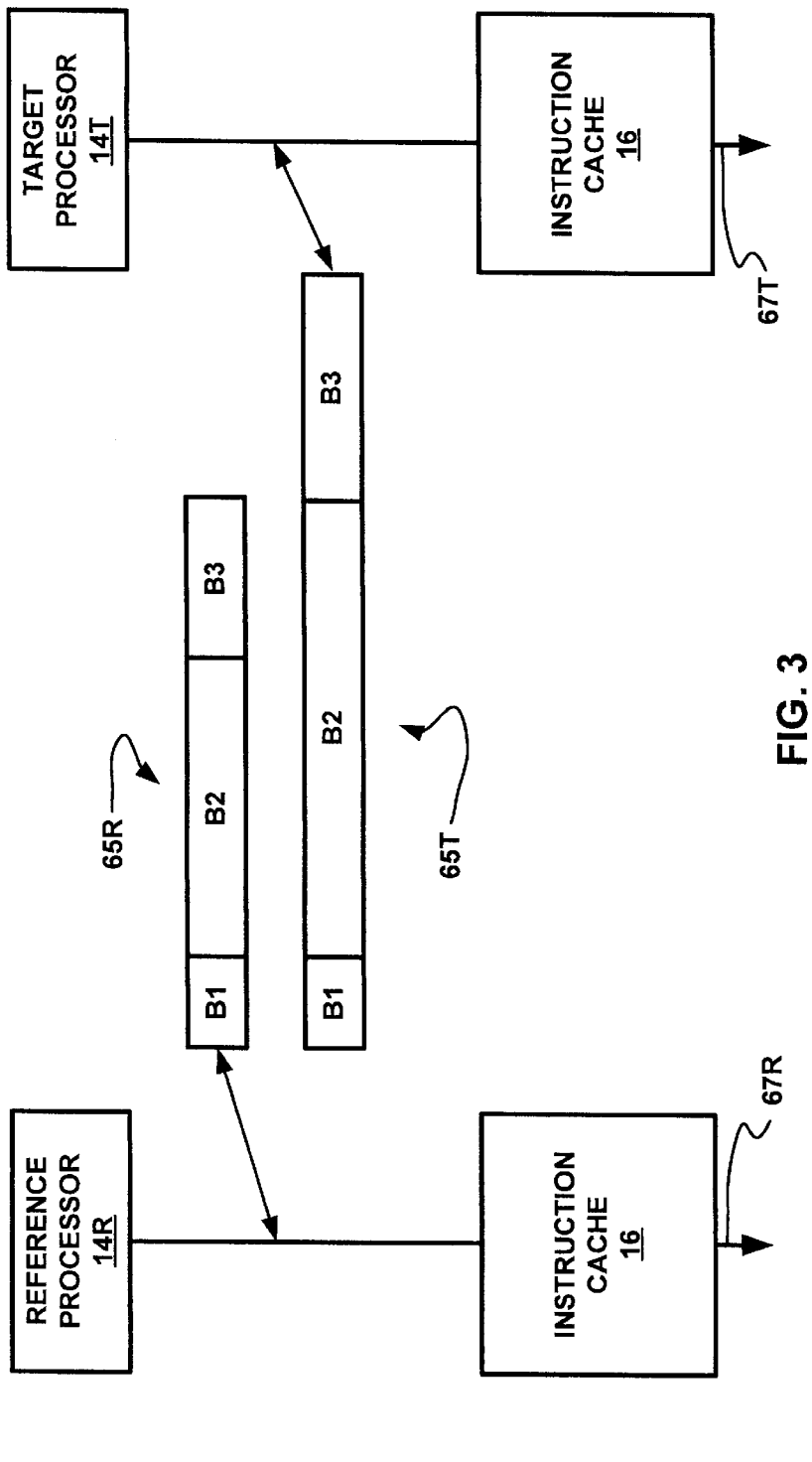
FIG. 3 is a schematic illustration of the present invention.
Figure 4:
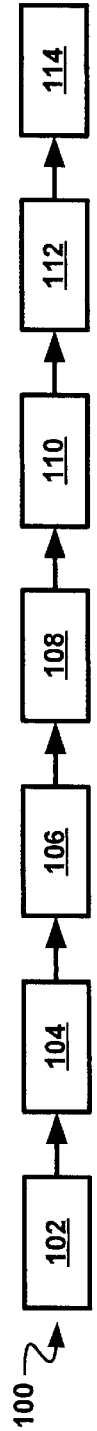
FIG. 4 is a flow chart of the method of the present invention.

Referring now to FIG. 3, therein is shown a schematic illustration of the present invention including a reference processor 14R and a target processor 14T from the design space 10. In the best mode, the reference processor 14R is a narrow-issue processor and the target processor 14T is a comparatively wide-issue processor. The reference processor 14R and the target processor 14T are respectively connected to the L1 instruction cache 16.

The reference processor 14R generates a reference address trace 65R. The reference address trace 65R contains the instruction component of the address trace consisting of basic blocks B1, B2, and B3 respectively, of predetermined lengths. The reference address trace 65R is provided to the L1 instruction cache 16 which generates a specific number of cache misses as an output 67R.

The target processor 14T could have a target address trace 65T. The target address trace 65T contains the instruction component of the address trace consisting of basic blocks B1', B2', and B3', respectively, of predetermined lengths. The target address trace 65T, when provided to the L1 instruction cache 16, would generate a specific number of cache misses as an output 67T.

In operation, the behavior of a target processor 14 with respect to the reference processor 14R can be characterized in terms of a few parameters, and among them are the dilation parameters. Roughly speaking, the dilation parameters represent how much the address trace would expand because of the change in the processor. Starting with the reference processor 14R and then going to some other wider-issue, target processor 14T which issues more instructions in a cycle, it is expected that the target processor 14T issues more references to the instruction cache. Therefore, the same program run on the target processor 14T will generate more references to the instruction cache than the reference processor 14R. The degree to which the cache behavior of the instruction stream of a target processor 14T differs from that of the referenced processor 14R is characterized by a set of dilation parameters. These dilation parameters are generated from examining the static characteristics of the compiled application for a particular target processor 14T and do not require time-consuming and compute-intensive trace generation for a target processor 14R. The dilation parameters are specific to a particular processor and change when attributes of a processor such as the number of functional units are changed.

Just as the instruction cache performance is determined by the instruction stream, the data cache performance is determined by the data stream, and the unified cache performance by the unified stream, which combines the data and instruction stream. A change in the processor from the reference to the target processor affects these three streams to different degrees. Accordingly, each of these streams is associated with a distinct set of dilation parameters.

In the case of the data stream, the data dilation may be determined by measuring the amount of data speculation in the scheduled code for a processor design. Provided control-flow profiling results are available, the amount of data speculation may be determined statically without actual simulation. But generally, changing the processor does not have a significant effect on the data stream itself if the data speculation of the reference processor 14R is close to the data speculation of the target processor. Thus, the data dilation parameter may be considered to be unity regardless of the processor.

In the case of the instruction stream, the instruction dilation may be determined by taking the ratio of the executable program on the target processor 14T to that on the reference processor 14R. The executable program could be one megabyte on the reference processor 14R, but with a wider processor with other characteristics, the executable program would go up to two megabytes. In this case, it could be assumed that when the two-megabyte executable program is executed on the wider processor, each reference made by the reference processor becomes two consecutive references. And therefore, the dilation parameter would be two. Alternately, the instruction dilation may be determined by taking the average weighted ratio of the size of individual scheduling regions in the compiled executable program for the two processors, where the weight of a scheduling region is the profiled frequency of execution of the scheduling regions.

The effect of instruction dilation on instruction cache misses is equivalent to a reduction in the cache line size by the instruction dilation factor. Thus, the instruction cache misses on the target processor design may be estimated from the number of misses incurred on the reference stream by an identical instruction cache, except that its line size is reduced by the dilation factor. In case such an instruction cache is not feasible because the dilated line size is not a power of two, the misses can be estimated through interpolation from the misses for two instruction caches with power-of-two line sizes that straddle the dilated line size. The miss rates for these two straddling instruction caches can be dramatically different. Further, the variation in miss rates between these two power-of-two line sizes is highly non-linear. Simple interpolation schemes such as linear schemes or curve-fitting approaches are either inaccurate or not programmatically automatable or both. The cache behavior model provides a much more accurate way of interpolating between the two power-of-two line size instruction caches.

Similarly, the data cache misses are estimated by assuming that the effect of data dilation is equivalent to a reduction in the cache line size by the data dilation factor. The data dilation does not affect instruction cache performance and instruction dilation does not affect data cache performance.

In the case of the unified cache stream, the dilation is more complicated because the instruction references and data references are both dilating but by differing amounts. The ranges for the caches are specified so that inclusion is satisfied between any data/instruction cache and the unified cache. This decouples the behavior of the unified cache from the data/instruction caches in the sense that the unified cache misses will not be affected by the presence of the data/instruction caches. Therefore, the unified cache misses may be obtained independently, regardless of the configuration of the L1 caches, by simulating the entire address trace.

The effect of instruction and data dilation on unified cache misses may be estimated using a cache behavior model. A cache behavior model determines a set of parameters from a trace. These parameters are used to determine the misses for a target cache on that trace. The parameters of the cache model are determined for the reference address trace 65R by actual examination of the trace. Generating the target trace 65T to determine the parameters of the cache model is time-consuming and compute-intensive. Instead, the known instruction and data dilation parameters of a target trace, together with the parameters of the cache model for the reference trace, are used to estimate the parameters of the cache model for the target trace. From the two sets of parameters, a scaling factor equal to the ratio of estimated misses on the target and reference address traces 65T and 65R, respectively, as predicted by the cache model are derived. The misses on a target trace are estimated as the product of the simulated misses on a reference trace and the scaling factor.

Traditionally, cache models assume a fixed trace and predict the performance of this trace on a range of possible cache configurations. In a typical application of a model, a few trace parameters are derived from the trace and used to estimate misses on a range of cache configurations. For instance, models for fully-associative caches employ an exponential or power function model for the change in working set over time. These models have been extended to account for a range of line sizes. The parameters of the exponential or power function are determined using a single simulation-like run through the address trace. Subsequently, the cache misses of a target fully-associative cache are estimated from the model and the derived parameters. Since primary interest herein is in direct-mapped and set-associative caches, these fully-associative cache models are not appropriate. More importantly, the cache models are used in a different manner here. Instead of using them to estimate the performance of various caches on a fixed trace, they are used to estimate the performance of caches on dilated versions of a reference trace.

A cache model is selected which characterizes cache misses into start-up, non-stationary and intrinsic interference misses, and divides the trace into time granules.

Let C(S, D, L) represent a cache C with S sets, associativity D, and a line size of L. Let _T_ be the number of granules, _tau_ the number of references per granule. Let u(L), be the average number of unique cache lines accessed in a time granule, U(L), the total number of cache lines accessed in the trace, and c, the dynamic collision coefficient. Then, m (C, t) the miss rate up to the _t_th granule is m(C, t)=u/_tau_t+(U−u)/_tau_T+c/tau(u−sigma from d=0 to d=D (S.d.P(d)) where the three components represent start-up, compulsory and steady-state interference, and P(d) is the probability that d cache lines are mapped to a particular set in the cache and more importantly that it is derived from u(L) as described below.

The assumption is made that intrinsic interference misses dominate so the start-up and non-stationary misses may be ignored. A reference miss rate of a cache, C_a (S_a, D_a, L_a) is used to estimate the miss rates of a target cache, C_b (S_b, D_b, L_b). Then, the steady state miss rate, m(C_b) is related to m(C_a) by:

m(C_b)=([u(L_b)−sigma from d=0 to d=D_b (S_b.d.P(L_b, d))]/[u(L_a)−sigma from d=0 to d=D_a (S_a.d.P(L_a, d))])*m(C_a)

Denoting Collision (S, D, L)=u(L_b)−sigma from d=D_b (S_b.d.P(L_b, d))

m(C_b)=Collision (S_b, D_b, L_b)/Collision (S_a, D_a, L_a)*m(C_a)

The above allows the determination of the miss rate of C_b from the known miss rate of C_a but u( ) and P( ) for C_a and C_b must be computed.

These computations require obtaining basic parameters from the trace. Within each granule, the references are sorted in each granule based on the address values, so that addresses that belong to a run will appear consecutively. An address is either part of a run, i.e. there are other references in the granule that neighbor this address, or the address is an isolated (singular) address. Let u(1), be the average number of unique references in a granule. Let p_1 be the average isolated references in a granule, i.e. the average of the ratios of isolated references to total references over all granules. Let l_av be the average run length, the number of consecutive addresses composing each run averaged over all the runs in a granule and over all the granules These three basic parameters relate the miss rate of any cache to any other cache as follows:

Given u(1), p_1 and l_av for a trace, then p_2 and u(L), P(L,d) for arbitrary L, d are determined using the following:

$$p\_2 = (l\_av - (1 + p\_1))/(l\_av - 1)$$

$$u(L) = u(1)(1 + p\_1/L - p\_2)/(1 + p\_1 - p\_2)$$

$$P(L, d) = (u(L) \text{ choose } d)(1/S)^d (1 - 1/S)^{(u(L) - d)}$$

Thus, given these three parameters and the miss rate for any cache, the miss rate of any other cache can be determined.

In the case of the instruction cache, only the instruction component of the trace is of interest. Therefore, in determining these basic parameters, the data component is filtered out and the instruction component is divided into granules. Each granule is processed as described earlier and values are obtained for the three basic parameters, u(1), p_1 and l_av for the entire trace.

In the case of the unified cache, the instruction and data components of the trace have to be separated out because only the instruction component is dilated. Therefore, a separate set of parameters is derived for the instruction component and the data component. The unified trace is divided into fixed-size granules and then the instruction and data addresses are separately sorted. For each of the two components, values for the three basic parameters are obtained. Thus, u_I(1), p1_I and lav_I for the instruction component and u_D(1), p1_D, and lav_D for the data component are obtained. For a specific cache configuration, u(L)=u_I(L)+u_D(L) are obtained where u_I(L) is a function of the three parameters obtained for the instruction component of the trace and u_D(L) is a function of the parameters for the data component. Once u(L) is obtained, the process of obtaining collisions is the same as for the instruction caches.

In the case of the instruction cache, it is possible to transform the problem into one of determining the misses on a related cache configuration using the undilated trace. This approach is not feasible for the unified cache because of the mix of an undilated component with a dilated component. Instead, the Misses equation is used:

Misses (Reference Processor Trace, dilation factor, Reference Unified Cache)/Misses(Reference Processor Trace, Reference Unified Cache)=Collision (Reference Processor Trace, dilation factor, Reference Unified Cache)/Collision(Reference Processor Trace, Reference Unified Cache)

In order to derive Misses (Reference Processor Trace, dilation factor, Unified Cache), it is necessary to determine the two collision terms, Collision (Reference Processor Trace, dilation factor, Reference Unified Cache), Collision (Reference Processor Trace, Reference Unified Cache) and the term Misses (Reference Processor Trace, Reference Unified Cache). Since the Reference Unified Cache is simulatable, Misses (Reference Processor Trace, Reference Unified Cache) are obtained through simulation. The problem now remains of determining collisions in a unified cache, with and without dilation.

As described in the earlier section, the following basic parameters are derived from a simulation-like run through the unified address trace: the average number of unique data and instruction references in a granule, u_D and u_I, the average probability of a singular reference in the data and instruction components, p1_D and p1_I, and the average run length on the data and instruction components, lav_D and lav_I.

In order to determine Collision (Reference Processor Trace, Reference Unified Cache), u_D(L) and u_I(L) are first determined as described earlier and then their sum is used as described earlier to compute Collision(Reference Processor Trace, Reference Unified Cache).

The procedure for determining Collision(Reference Processor Trace, dilation factor, Reference Unified Cache) takes into account that the instruction stream is dilated but not the data stream. In estimating the instruction cache misses, the dilation of the instruction stream is transformed to an equivalent reduction in line size. In a similar manner, u(L, dilation factor)=u__D(L)+u__I(L/dilation factor) is approximated. Then u(L, dilation factor) is substituted in the expression for Collision(Reference Processor Trace, dilation factor, Reference Unified Cache). Now that the two collision terms and the misses on the undilated trace using simulation are determined, an estimate misses of the dilated trace can be made using the Misses equation.

It should be understood that predication and speculation have a large impact on address traces. Therefore, the reference processor 14R and target processor 14T must have the same data speculation and predication features, i.e. if reference processor 14R supports predication, so does target processor 14T. If the design space 10 covers machines with differing predication/speculation features, it is necessary to use several reference processors 14R, one for each unique combination of predication and speculation.

A method 100 for designing a computer system with a predetermined application, comprising the steps of: selecting a reference computer system 102; determining a performance characteristic of said reference computer system using the predetermined application 104; determining a code parameter of said reference computer system using the predetermined application 106; selecting a target computer system, said selecting said reference and said target computer systems selects systems having similar degrees of speculation 108; determining a code parameter of said target computer system using the predetermined application, such as determining an address trace parameter of said target processor using the predetermined application 110; determining a dilation parameter from the code parameter of said reference computer system and the code parameter of said target computer system 112; and using the dilation parameter to determine a comparable performance characteristic of said target computer system to the performance characteristic of said reference computer system 114.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for designing a computer system with a predetermined application, comprising the steps of:
   selecting a reference computer system;
   determining the performance characteristic of said reference computer system by running a reference computer system simulation using the predetermined application;
   determining a code parameter of said reference computer system using the predetermined application;
   selecting a target computer system;
   determining a code parameter of said target computer system using the predetermined application;
   determining a dilation parameter from the code parameter of said reference computer system and the code parameter of said target computer system; and
   using the dilation parameter to determine a comparable performance characteristic of said target computer system to the performance characteristic of said reference computer system.

2. The method as claimed in claim 1 wherein said steps of:
   determining the performance characteristic of said target computer system determines a memory performance characteristic of a memory system provided in said target computer system;
   determining the code parameter of said target computer system determines a memory code parameter of said memory system;
   determining the dilation parameter determines a memory dilation parameter; and
   using the memory dilation parameter to determine the comparable performance characteristic determines a memory performance characteristic of said target computer system.

3. The method as claimed in claim 2 wherein said steps of:
   determining the code parameters of said reference and said target computer systems uses object codes of said reference and said target computers systems.

4. The method as claimed in claim 3 wherein said steps of:
   determining the code parameters of said reference and said target computer systems to represent data stream characteristics of said reference and said target computer systems;
   determining the dilation parameter includes determining data dilation parameters of said reference and said target computer systems from the dynamic number of load/store instructions by summing, over all scheduled basic blocks in the object code, the product of the number of load/store instructions in the scheduled basic block times the frequency of execution of the scheduled basic block, and
   determining the data dilation parameter uses the ratio of the dynamic number of load/store instructions in said reference and said target computer systems.

5. The method as claimed in claim 3 wherein said steps of:
   selecting said reference and said target computer systems selects systems having similar degrees of speculation; and
   determining the data dilation parameter uses data stream characteristics of said reference and said target computer systems and is unity.

6. The method as claimed in claim 3 wherein said steps of:
   determining the code parameters of said reference and said target computer systems uses instruction trace portions of the object codes of said reference and said target computer systems; and
   determining the dilation parameter uses the ratio of the dynamic sizes of instructions fetched in said reference and said target computer systems.

7. The method as claimed in claim 3 wherein said steps of:
   determining the dilation parameter uses instruction trace portions of the object codes of said reference and said target computer systems; and
   determining the dilation parameter uses the ratio of the sizes of the object codes on said target and said reference computer systems.

8. The method as claimed in claim 3 wherein said step of:
   determining the code parameters of said reference and said target computers uses instruction trace portions of the object codes of said reference and said target computers.

9. The method as claimed in claim 3 wherein said steps of:
   determining the code parameters of said reference and said target computers uses data and instruction line sizes of the object codes of said reference and said target computers; and determining the memory dilation parameter determines data and instruction dilation parameters using the code parameters; and determining the performance characteristic of data and instruction portions of the memory system performance on said target computer system from the performance characteristic of a similar reference memory system with a line size modified by respective data and instruction dilation parameters.

10. The method as claimed in claim 3 wherein said steps of:

determining the code parameters of said reference and said target computers uses data and instruction line sizes of the object codes of said reference and said target computers; and determining the memory dilation parameter determines data and instruction dilation parameters using the code parameters and a unified dilation parameter using a combination of the data and instruction dilation parameters; and determining the performance characteristic of data, instruction, and unified portions of said memory system performance on said target computer system from the performance characteristic of a similar reference memory system with a line size modified by respective data, instruction, and unified dilation parameters.

11. A method for designing a computer system with a predetermined application, comprising:

selecting a reference computer system having a reference processor and a reference memory hierarchy;

determining the memory performance characteristic of said reference processor running a reference computer system simulation: using the predetermined application;

determining an address trace parameter of said reference processor using the predetermined application;

selecting a target computer system having a target processor and a target memory hierarchy;

determining an address trace parameter of said target processor using the predetermined application;

determining a dilation parameter from the address trace parameters of said reference processor and the address trace parameter of said target processor; and using the dilation parameter to determine the memory performance characteristic of said target memory hierarchy to the memory performance characteristic of said reference memory hierarchy.

12. The method as claimed in claim 11 wherein said steps of:

determining the memory performance characteristic of said target computer system determines cache performance of the target memory hierarchy;

determining the address trace parameter of said target memory hierarchy determines an instruction, data or unified trace parameter of said memory system;

determining the dilation parameter determines an instruction, data, or unified cache dilation parameter; and using the cache dilation parameter to determine the comparable cache performance characteristic determines a cache performance characteristic of said target cache system.

13. The method as claimed in claim 12 wherein said steps of:

determining the address trace parameters of said reference and said target computer systems uses object codes of said reference and said target systems.

14. The method as claimed in claim 13 wherein said steps of:

determining the address trace parameters of said reference and said target processors to represent data stream characteristics of reference and target processors; and determining the dilation parameter uses the ratio of the dynamic number of load/store instructions in the reference and target object codes.

15. The method as claimed in claim 13 wherein said steps of:

selecting said reference and said target processors selects processors having similar degrees of speculation; and determining the dilation parameter to represent the data stream characteristics of the reference and target processors.

16. The method as claimed in claim 13 wherein said steps of:

determining the address trace parameters of said reference and said target processors to represent the instruction stream characteristics of the reference and target object codes; and determining the dilation parameter uses the ratio of the dynamic size of instructions fetched in said reference and said target processor systems.

17. The method as claimed in claim 13 wherein said steps of:

determining the dilation parameter to represent the instruction stream characteristics of the reference and target processor systems; and determining the dilation parameter uses the ratio of the sizes of the reference and target object codes.

18. The method as claimed in claim 13 wherein said step of:

determining the address trace parameters of said reference and said target processors to represent instruction stream characteristics of the reference and target processor systems.

19. The method as claimed in claim 13 wherein said step of:

determining the memory performance characteristic of said target memory hierarchy determines the miss rate and stall cycles thereof.

20. The method as claimed in claim 13 wherein said step of: selecting said reference and target processors includes selecting very long instruction word processors.

* * * * *